(12) United States Patent
Raben

(10) Patent No.: US 8,049,290 B2
(45) Date of Patent: Nov. 1, 2011

(54) INTEGRATED CIRCUIT PACKAGE

(75) Inventor: Jurgen Leonardus Theodorus Maria Raben, Terborg (NL)

(73) Assignee: Sencio B.V., Nijmegen (NL)

( * ) Notice: Subject to any disclaimer, the term of this patent is extended or adjusted under 35 U.S.C. 154(b) by 186 days.

(21) Appl. No.: 12/369,959

(22) Filed: Feb. 12, 2009

(65) Prior Publication Data

US 2009/0206467 A1 Aug. 20, 2009

(30) Foreign Application Priority Data

Feb. 14, 2008 (EP) .................................... 08151407

(51) Int. Cl.
*H01L 31/0203* (2006.01)
(52) U.S. Cl. .................... 257/433; 257/434; 257/680
(58) Field of Classification Search .................. 257/433, 257/680, 434
See application file for complete search history.

(56) References Cited

U.S. PATENT DOCUMENTS

| | | | |
|---|---|---|---|
| 5,207,102 A | 5/1993 | Takahashi et al. | |
| 6,300,169 B1 * | 10/2001 | Weiblen et al. | 438/127 |
| 6,401,545 B1 * | 6/2002 | Monk et al. | 73/756 |
| 6,521,966 B1 | 2/2003 | Ishio et al. | |
| 7,554,184 B2 * | 6/2009 | Webster et al. | 257/680 |
| 2006/0001116 A1 * | 1/2006 | Auburger et al. | 257/433 |
| 2009/0072333 A1 | 3/2009 | Haag et al. | |

FOREIGN PATENT DOCUMENTS

| | | |
|---|---|---|
| DE | 103 16 084 | 5/2004 |
| DE | 10 2005 038 443 | 2/2007 |
| WO | 2007/017301 | 2/2007 |

OTHER PUBLICATIONS

C. Cotofana et al., "Low-cost plastic sensor packaging using the open-window package concept", Sensors and Actuators A, May 15, 1998, pp. 185-190, vol. 67, Elsevier Sequoia S.A.
Extended European Search Report, dated Jul. 21, 2008 and issued in corresponding European Patent Application No. 08151407.7-1236.

* cited by examiner

*Primary Examiner* — Phat Cao
(74) *Attorney, Agent, or Firm* — Young & Thompson

(57) ABSTRACT

Package (1) having a sensor assembly (2) with at least one sensitive surface (21) and an attachment surface (22), a carrier element (3) with a sensor attachment area (31), and a sensor attach material (4) for attaching the sensor assembly (2) to the sensor attachment area (31) of the carrier element. The package (1) comprises an encapsulation (5) of a first material, in which the encapsulation (5) covers the sensor attachment area (31) of the carrier element (3) and the sensor attach material (4) and leaves the at least one sensitive surface (21) free from the first material.

9 Claims, 2 Drawing Sheets

INTEGRATED CIRCUIT PACKAGE

FIELD OF INVENTION

The present invention relates to a package for a sensor assembly, the package comprising a sensor assembly having at least one sensitive surface and an attachment surface, a carrier element (e.g. a lead frame) having a sensor attachment area, and a sensor attach material for attaching the sensor assembly to the sensor attachment area of the carrier element.

BACKGROUND

International patent publication WO2007/017301 discloses a package for a pressure sensor of a micromechanical type. The package is completely sealed, and the external pressure is transmitted mechanically to the sensor surface in the package, using various embodiments of pressure transmission means. Such a sealed package has the advantage that the sensitive surface of the sensor is completely blocked from the external environment and thus protected against possibly damaging influences of the external environment. In some applications however, it is desired that a direct contact path is available from the environment to the sensitive surface of a sensor in a package.

SUMMARY OF THE INVENTION

The invention aims to provide an improved package with a predetermined shape and well defined dimensions, allowing the use of a sensor which requires direct contact with its environment.

According to a first aspect of the invention a package as defined above is provided in which the package comprises an encapsulation of a first material, in which the encapsulation covers the sensor attachment area of the carrier element and the sensor attach material and leaves the at least one sensitive surface free from the first material. The first material may be a commonly used resin for packaging purposes, but also a duroplast material. The resin used for packaging purposes may be a thermoharder epoxy material, as commonly used for encapsulation of semiconductor devices. It basically comprises a resin, a harder, a catalyst and possibly other additives. When heated, cross linking of molecules takes place (polymerisation). After this chemical reaction, the material cannot be melted again. In this manner, the external (harsh) environment can only reach the sensitive surface of the sensor assembly (and possibly some area surrounding it), and the package material itself, but not any other elements in the package, such as the carrier element and the attachment material. This provides for a very robust and reliable package for a sensor, while still enabling direct contact with the sensitive surface. Furthermore, the package can be manufactured without inducing stress on the sensor assembly itself, thus preventing erroneous functioning of the sensor assembly or reduced sensitivity. The carrier element e.g. comprises a lead frame, or other types of chip manufacturing carrier elements, such as substrates, terminal pads of a Quad Flat No lead (QNF) package, or a Ball Grid Array (BGA) package.

In a further embodiment, the encapsulation furthermore encapsulates electrical connections between sensor assembly and the carrier element, e.g. in the form of bonding wires, BGA connections, flip-chip connections, etc.

In order to more accurately match thermal expansion coefficients of elements inside the package (especially between the sensor assembly and the carrier element), the sensor attachment area may be part of a separate element attached to (e.g. mounted to) the carrier element in a further embodiment. The material of the separate element may be of a duroplast material also, or of a thermoplast material.

In an even further embodiment, the sensor assembly is partially surrounded by a second material different from the first material, e.g. using a cavity in the encapsulation. In a further embodiment, the sensor assembly is then covered by a gel like material. The second material may provide a shielding function, protecting the sensor assembly for stress induced during or after manufacturing of the package, but also may provide an electromagnetic compatibility (EMC) shielding function during operation. A cavity is in a further embodiment formed by a pre-moulded cavity attached to the carrier element, e.g. using a moulding technique. Again, a suitable material may be selected to minimise the influence of stress induced by different expansion coefficients of the various elements in the package.

The first material is in a further embodiment a duroplast material comprising a low stress compound. During manufacturing of the package, and especially during curing, this provides less stress inside the package. The carrier element is in a further embodiment of a material having a thermal expansion coefficient comparable to that of the material of the sensor assembly. This furthermore helps to reduce stress related disadvantageous effects on the assembled package (lowered sensitivity or incorrect functioning).

The sensor attach material comprises one or more from the group comprising a commonly used epoxy, low stress epoxy, silicone gel, etc. As the sensor attach material is shielded from the (harsh) environment by the enclosure, it is possible to select the most appropriate material therefore to match expansion coefficients of the other elements in the package.

DESCRIPTION OF THE DRAWINGS

The invention will be described in more detail referring to embodiments of the present invention as shown in the attached drawings, wherein.

DETAILED DESCRIPTION OF EMBODIMENTS

Figure 1:
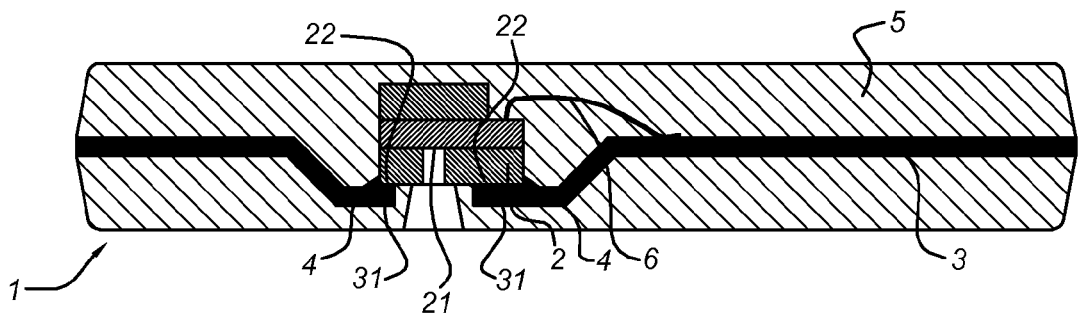
FIG. 1 shows a cross sectional view of a package according to a first embodiment of the present invention.

In FIG. 1 a first embodiment of the package 1 according to the invention is shown in a cross sectional view. The package 1 comprises a carrier element 3 in the form of a lead frame carrier onto which a sensor assembly 2 is attached. The lead frame carrier 3 is used to provide the external electrical connections of the package 1, but in some packages also forms a supporting structure for the sensor assembly 2 (during production).

The sensor assembly 2 is in this embodiment a sensor which requires to be exposed to the outside of the package 1, and e.g. comprises a micro electromechanical sensor (MEMS) such as a g-sensor or pressure sensor. For these types of sensors, the sensor sensitivity is important, as well as a number of other operational characteristics, such as hysteresis or stress induced errors. These operational characteristics are influenced by the manner in which the package 1 is assembled.

In further detail, the sensor assembly 2 comprises a sensitive surface 21 and, in the embodiment shown, two sensor attachment surfaces 22. The lead frame carrier 3 comprises two sensor attachment areas 31, to which the sensor attachment surfaces 22 are mounted using a sensor attach material 4. The sensor attach material 4 may e.g. be a low stress epoxy or a kind of gel (such as silicone gel). The sensor assembly 2 provides its signals to the lead frame carrier using electrical connections 6, e.g. wires as shown in this embodiment (using wire bonding).

During assembly of the package 1, an encapsulation or enclosure 5 of a first (duroplast) material is made, in which the encapsulation 5 covers at least the sensor attachment area 31 of the lead frame carrier 3 and the sensor attach material 4. Also, the electrical connections 6 are covered by the encapsulation 5. The sensitive surface 21 of the sensor assembly 2 and a surrounding area thereof are kept free from the duroplast material. By having these elements of the package covered by the encapsulation 5, an exposure to harsh environments has no or only negligible effect on the operational and reliability characteristics of the package 1 with sensor assembly 2. In general, the adhesion of duroplast material directly to the material of the sensor assembly 2 (just outside the attachment surface 22) is sufficiently resistant to harsh environments.

A duroplast material is considered herein to be a composite thermosetting plastic. E.g., it is a resin plastic reinforced with fibres (either cotton or wool), making it a fibre-reinforced plastic similar to glass-reinforced plastic. The duroplast material is e.g. a moulding compound having low stress when being cured.

When designing a package for sensitive MEMS devices following should be considered:

The use of a low stress duroplast material e.g. has a high filler amount, and a low thermal expansion above and below the glass temperature Tg.

The lead frame carrier 3 is of a material which is chosen to have a thermal expansion coefficient which is in the same order of magnitude as the thermal expansion coefficient of the (cured) duroplast material of the encapsulation 5. For the lead frame carrier 3 the use of Alloy42 yields a better result than the conventional copper material.

Furthermore, the lead frame carrier 3 might be formed by a plastic die-pad from duroplast or thermoplast material.

Using this embodiment, it is possible to have a reliable overmoulding of the sensor assembly 2, which is important for the functioning and sensitivity and other operational characteristics. The moulding compound shrinkage during curing may e.g. induce stress after assembly, and also differences in thermal expansion coefficients may induce stress related effects on the operational characteristics during operation. Even the sensor attach material 4 may influence operational characteristics, e.g. resulting in a hysteresis of the sensor output signal. With the present embodiment, it is possible to obtain a reliable package 1 which is able to withstand harsh environments, such as encountered in engine exhaust applications and other automotive applications. This is primarily due to the fact that only a small part of the sensor assembly 2 (sensitive surface 21 and small surrounding area) is exposed to the environment, and all other parts and elements in the package 1 are screened off from this environment.

Of course, the sensitive surface 21 of the sensor assembly may also be provided at the top part of the sensor assembly 2, with a corresponding opening in the top part of the package 1. Even further, the package 1 may be provided with two openings, both at the top and bottom part, e.g. in case of the application of a differential sensor in the sensor assembly 2. Also, the sensor assembly 2 may be provided with more than one sensitive surface 21, e.g. combining several sensors in one sensor assembly 2. The package 1 may then be provided with a single opening or multiple openings.

In a further alternative of the embodiment shown in FIG. 1, the lead frame carrier 3 is provided with only one sensor attachment area 31 (and the sensor assembly 2 with only a single corresponding attachment surface 22).

Figure 2:
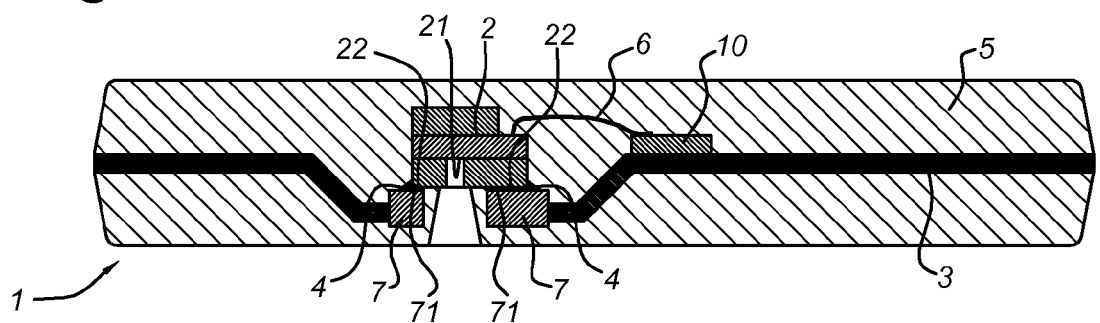
FIG. 2 shows a cross sectional view of a package according to a second embodiment of the present invention.

In FIG. 2 a further embodiment of the present invention is shown, in which a further electronic component 10, e.g. an application specific integrated circuit (ASIC), is part of the package 1. The component 10 is attached to the lead frame carrier 3, and completely encapsulated with the duroplast material. The ASIC 10 may e.g. be provided to condition or pre-process the signal from the sensor assembly 2, via the electrical connection 6.

To further enhance the reliable encapsulation of the sensor assembly 2, the lead frame carrier 3 is provided with a separate element 7 attached or moulded to the lead frame carrier 3. The sensor attachment area 71 is then provided by this separate element 7. By choosing a different material for the separate element, e.g. a thermoplast or other material, a better match can be made with the sensor assembly material in order to alleviate or lessen possible stresses on the sensor assembly 2, as compared to the material of the lead frame carrier 3.

Figure 3:
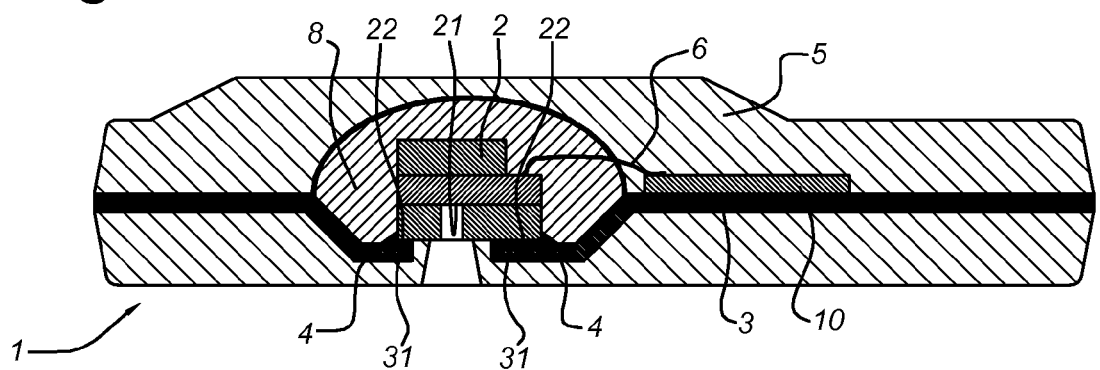
FIG. 3 shows a cross sectional view of a package according to a third embodiment of the present invention.

An even further embodiment is schematically shown in FIG. 3. In this embodiment, again an electronic component 10 is comprised in the package 1, connected to the sensor assembly 2 using a bonding wire 6. The lead frame carrier 3 can be provided with a recessed area including the sensor attachment areas 31. Prior to the duroplast material being inserted when moulding the encapsulation 5, the sensor assembly 2 is covered with a second material, e.g. a gel like material. As a result a cavity 8 is created above the sensor assembly 2, which is almost entirely filled with the gel like material. Due to the fact the expansion/shrinkage of the gel like material is significant higher compared to the thermoharder material of the encapsulation 5 a gap will be created after encapsulation. This gap decouples the sensor from the encapsulation (below a certain temperature, depending on the expansion factor of the gel like material). Proper selection of the second material may provide further benefits, e.g. shielding for electromagnetic compatibility (EMC) purposes. Again, all elements of the package 1 are shielded from the environment, with the exception of the sensitive surface 21 and a small surrounding area of the sensor assembly 2.

Figure 4:
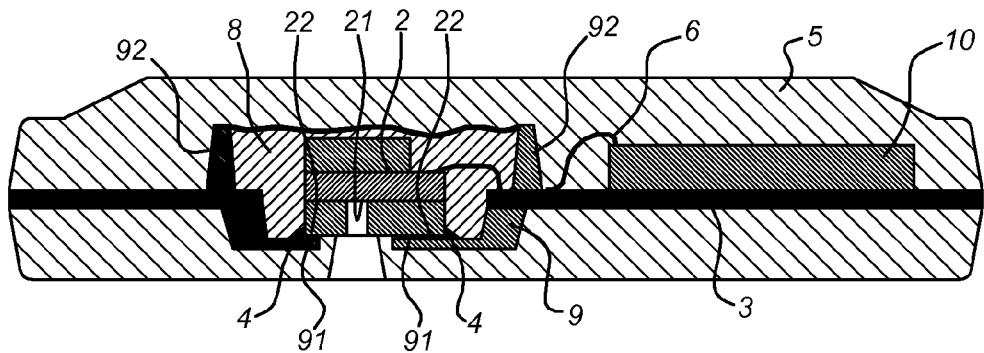
FIG. 4 shows a cross sectional view of a package according to a fourth embodiment of the present invention.

FIG. 4 shows a schematic cross sectional view of an even further embodiment of the present invention. Here the separate attachment element 7 of the FIG. 2 embodiment is provided as a pre-moulded cavity 9. This premoulded cavity 9 may be of duroplast or thermoplast material, and includes a sensor attachment area 91. The premoulded cavity 9 may be provided with rims 92, thus forming the cavity 8 above the sensor assembly 2, which may be filled again with e.g. a gel like material.

As an alternative for the FIGS. 3 and 4 embodiments, the cavity 8 is not filled with a gel like material, but left filled with surrounding air or a vacuum. For this, an additional processing step is necessary, in which the cavity 8 is closed off before application (injection) of the duroplast material to form the encapsulation 5.

In the above embodiments, packages 1 have been shown and described which are provided with a lead frame carrier 3. However, the present invention may also be applied in other types of packages 1, e.g. Quad Flat No Lead (QFN) packages 1, or Ball Grid Array (BGA) packages 1.

Figure 5:
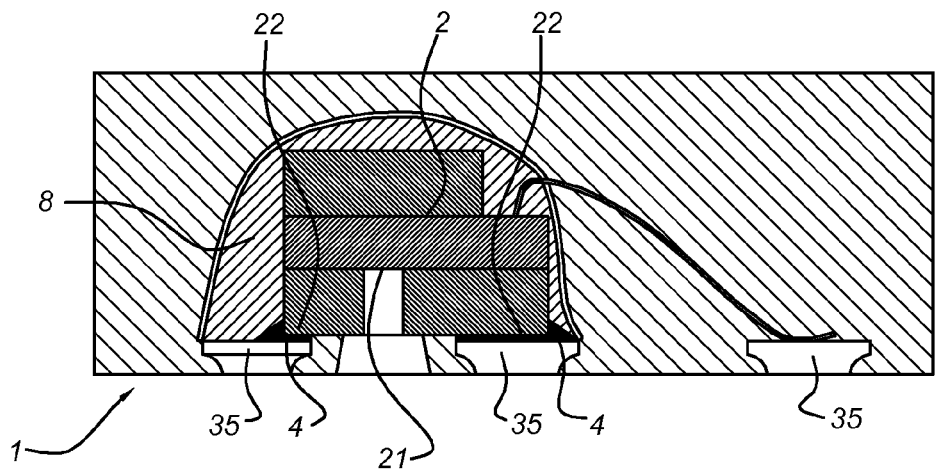
FIG. 5 shows a cross sectional view of a package according to a fifth embodiment of the present invention.

An embodiment of a QFN package 1 is shown in cross sectional view in FIG. 5. The QFN package 1 comprises a number of connecting pads 35, of which one or more act as sensor attachment area for the sensor assembly 2. In a QFN package, the connecting pads 35 are the functional equivalent of the lead frame carrier 3 as described above. Again, the attachment surfaces 21 of the sensor assembly 2 are attached to the connecting pads 35 using an attachment material 4. When injecting the duroplast material for the encapsulation 5, again the sensitive surface 21 and a small surrounding area of the sensor assembly are the only parts of the package 1 exposed to the environment.

Figure 6:
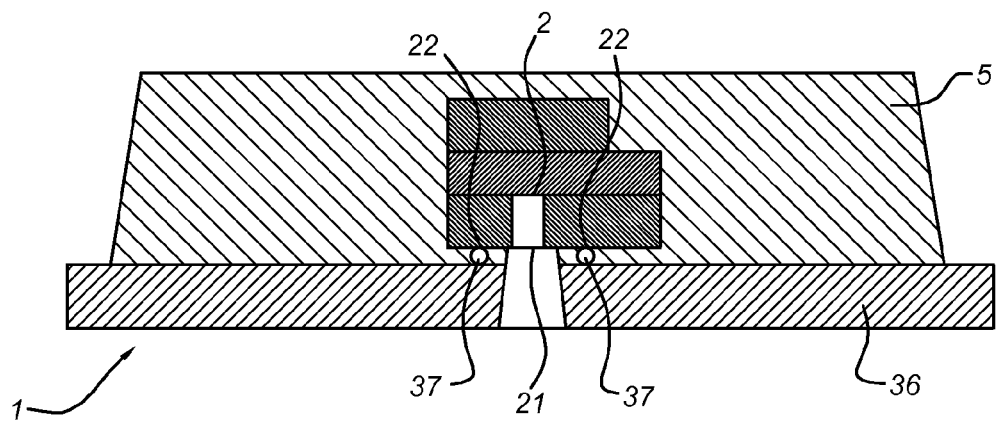
FIG. 6 shows a cross sectional view of a package according to a sixth embodiment of the present invention.

An embodiment of a BGA package 1 is shown in cross sectional view in FIG. 6. The BGA package 1 comprises a connecting board 36, and conductive balls 37. The conductive balls 37 act as electrical connections 6 to connect the sensor assembly 2 to the board 36, but also as attachment material (using soldering techniques). Again, when injecting the duroplast material for the encapsulation 5, the sensitive surface 21 and a small surrounding area of the sensor assembly are the only parts of the package 1 exposed to the environment.

Furthermore, it is possible to use the present invention embodiments in packages 1 in which the lead frame carrier 3 is formed by a film or substrate, and also in flip-chip applications.

It will be clear that the embodiments as described above are included to illustrate embodiments of the invention, which are not meant to limit the scope of protection. Starting from this disclosure, many more embodiments and alternatives will be evident to a skilled person which are within the scope of protection.

The invention claimed is:

1. A package for a sensor assembly, the package comprising:
the sensor assembly having at least one sensitive surface and an attachment surface;
a carrier element having a sensor attachment area;
a sensor attach material for attaching the sensor assembly to the sensor attachment area of the carrier element; and
an encapsulation of a first material, the encapsulation covering the sensor attachment area of the carrier element and the sensor attach material and leaving the at least one sensitive surface free from the first material,
wherein the carrier element is a lead frame having external electrical connections, and
wherein the lead frame has an opening in communication with the at least one sensitive surface.

2. The package according to claim 1, wherein the encapsulation furthermore encapsulates electrical connections between the sensor assembly and the carrier element.

3. The package according to claim 1, wherein the sensor attachment area is part of a separate element attached to the carrier element.

4. The package according to claim 1, wherein the sensor assembly is partially surrounded by a second material different from the first material.

5. The package according to claim 4, wherein the sensor assembly is covered by a gel like material.

6. The package according to claim 4, wherein a cavity is formed by a premoulded cavity attached to the carrier element.

7. The package according to claim 1, wherein the first material is a duroplast material comprising a low stress compound.

8. The package according to claim 1, wherein the carrier element is of a material having a thermal expansion coefficient substantially equal to that of the material of the sensor assembly.

9. The package according to claim 1, wherein the sensor attach material comprises one or more from the group comprising an epoxy, a low stress epoxy, silicone gel.

* * * * *